(12) United States Patent
Hsieh et al.

(10) Patent No.: US 11,229,135 B2
(45) Date of Patent: Jan. 18, 2022

(54) MULTIPLE FUNCTION CHASSIS MID-CHANNEL

(71) Applicant: DELL PRODUCTS L.P., Round Rock, TX (US)

(72) Inventors: Nelson Hsieh, Taoyuan (TW); Kuang Hsi Lin, TaouYuan County (TW)

(73) Assignee: DELL PRODUCTS L.P., Round Rock, TX (US)

( * ) Notice: Subject to any disclaimer, the term of this patent is extended or adjusted under 35 U.S.C. 154(b) by 316 days.

(21) Appl. No.: 16/371,424

(22) Filed: Apr. 1, 2019

(65) Prior Publication Data

US 2020/0315049 A1 Oct. 1, 2020

(51) Int. Cl.
*H05K 5/02* (2006.01)
*H05K 7/20* (2006.01)

(52) U.S. Cl.
CPC ......... *H05K 5/0247* (2013.01); *H05K 5/0221* (2013.01); *H05K 5/0226* (2013.01); *H05K 7/20145* (2013.01); *H05K 7/20172* (2013.01)

(58) Field of Classification Search
None
See application file for complete search history.

(56) References Cited

U.S. PATENT DOCUMENTS

| | | | |
|---|---|---|---|
| 5,740,300 A * | 4/1998 | Hodge | G02B 6/4452 385/134 |
| 6,697,345 B1 | 2/2004 | Corrigan, III et al. | |
| 7,445,490 B2 * | 11/2008 | Jacobson | H01R 13/5205 439/447 |
| 7,730,205 B2 | 6/2010 | Rothman et al. | |
| 8,191,101 B2 | 5/2012 | Baran et al. | |
| 8,472,447 B2 | 6/2013 | Humphries | |
| 8,601,053 B2 | 12/2013 | Mehrotra et al. | |
| 8,879,882 B2 * | 11/2014 | Conner | G02B 6/4471 385/135 |
| 9,059,940 B2 | 6/2015 | Jacob Da Silva et al. | |
| 9,075,217 B2 * | 7/2015 | Giraud | G02B 6/4452 |
| 9,366,838 B2 * | 6/2016 | Barnes | G02B 6/4469 |
| 2004/0246891 A1 | 12/2004 | Kay et al. | |
| 2009/0194647 A1 * | 8/2009 | Keith | H04Q 1/13 248/68.1 |
| 2012/0288244 A1 * | 11/2012 | Wu | G02B 6/4277 385/94 |
| 2014/0079366 A1 * | 3/2014 | Rodriguez | G02B 6/36 385/136 |
| 2019/0254188 A1 * | 8/2019 | Cmich | H05K 5/069 |

FOREIGN PATENT DOCUMENTS

| | | |
|---|---|---|
| CN | 1656465 B | 5/2010 |
| EP | 0986483 | 6/1998 |
| KR | 100195364 B1 | 6/1999 |

* cited by examiner

*Primary Examiner* — Xanthia C Cunningham
(74) *Attorney, Agent, or Firm* — Jackson Walker LLP; Christopher J. Rourk

(57) ABSTRACT

An assembly is disclosed that includes a planar surface, a reconfigurable housing disposed on the planar surface, a hinge assembly coupled to the reconfigurable housing, a door coupled to the hinge assembly, the door having a latch that is configured to secure the door in a closed position against the reconfigurable housing and a seal configured to reduce airflow through the reconfigurable housing.

20 Claims, 5 Drawing Sheets

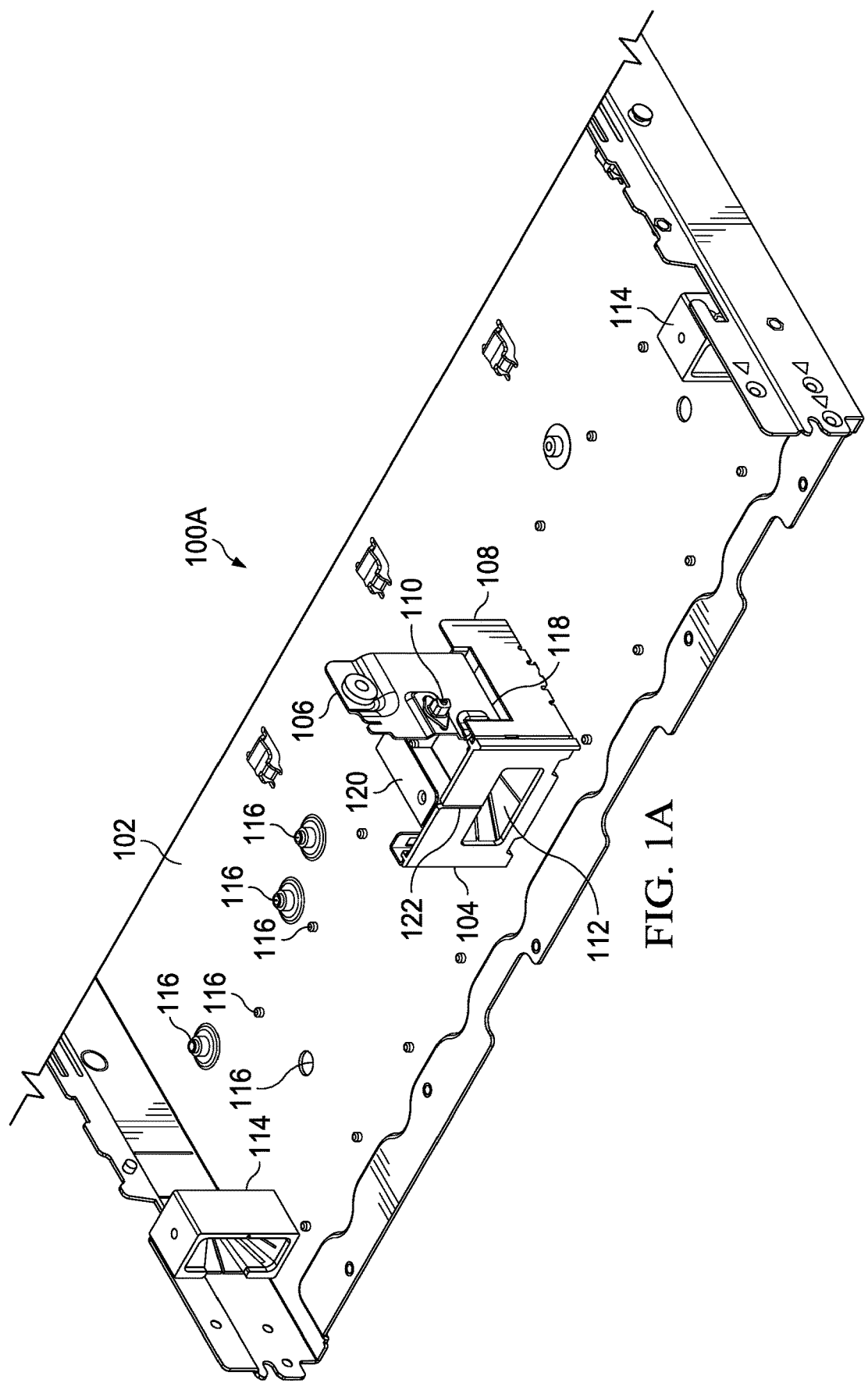

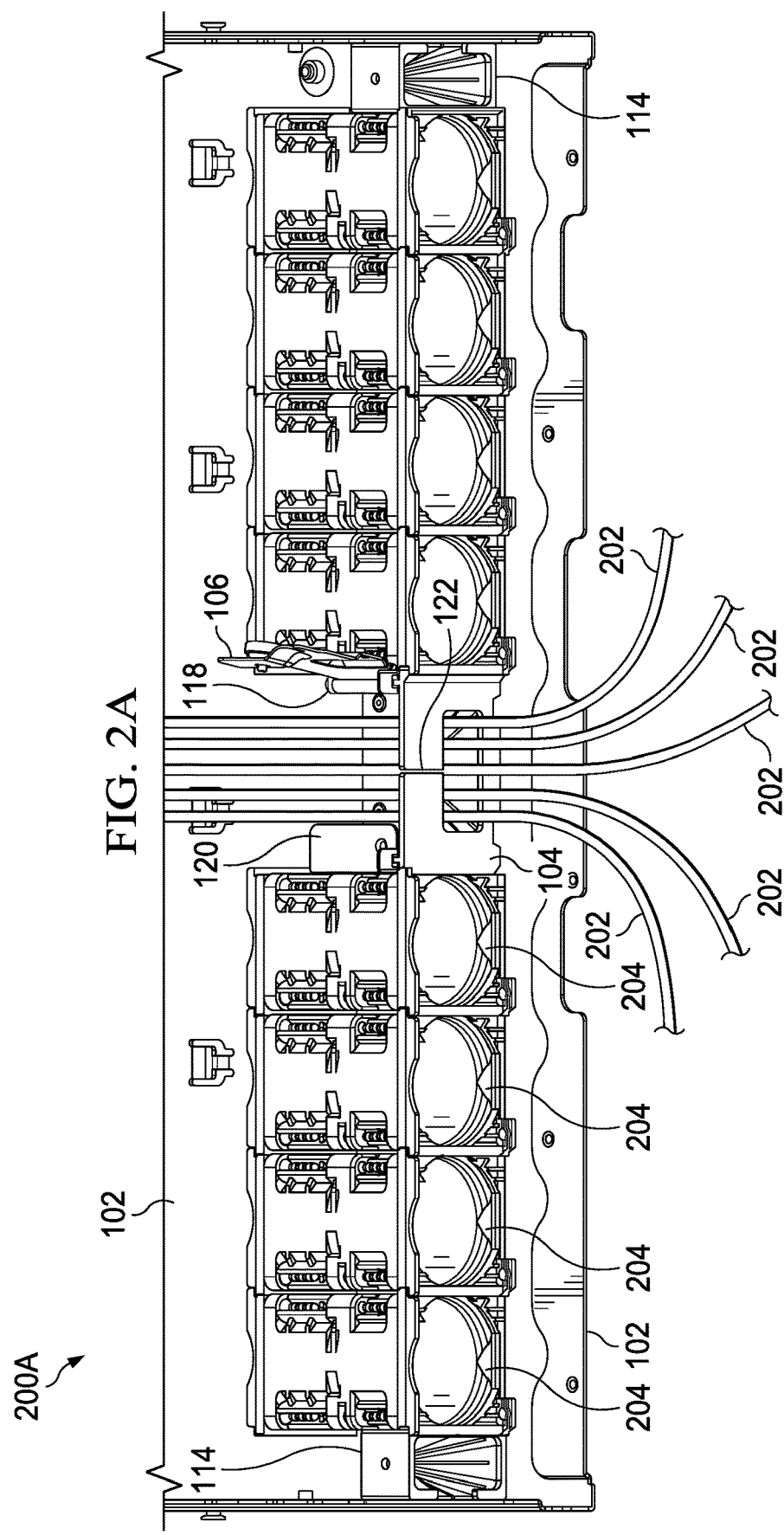

MULTIPLE FUNCTION CHASSIS MID-CHANNEL

TECHNICAL FIELD

The present disclosure relates generally to electronic equipment housing structures, and more specifically to a multiple function chassis mid-channel structure for use in an electronic equipment housing structure.

BACKGROUND OF THE INVENTION

Electronic equipment housings are typically custom designed and are difficult to repair or retrofit. These electronic equipment housings are usually thrown away after being used if a component breaks and cannot be easily replaced.

SUMMARY OF THE INVENTION

An assembly is disclosed, such as an electronic equipment housing. The assembly includes a planar surface, a reconfigurable housing disposed on the planar surface, a hinge assembly coupled to the reconfigurable housing, a door coupled to the hinge assembly, the door having a latch that is configured to secure the door in a closed position against the reconfigurable housing and a seal configured to reduce airflow through the reconfigurable housing.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which:

FIG. 1A is a diagram of an electronic component housing with an open reconfigurable cable access component, in accordance with an example embodiment of the present disclosure;

FIG. 2A is a diagram of an electronic component housing with an open reconfigurable cable access component, cabling and fan housing assemblies, in accordance with an example embodiment of the present disclosure;

DETAILED DESCRIPTION OF THE INVENTION

Figure 1B:
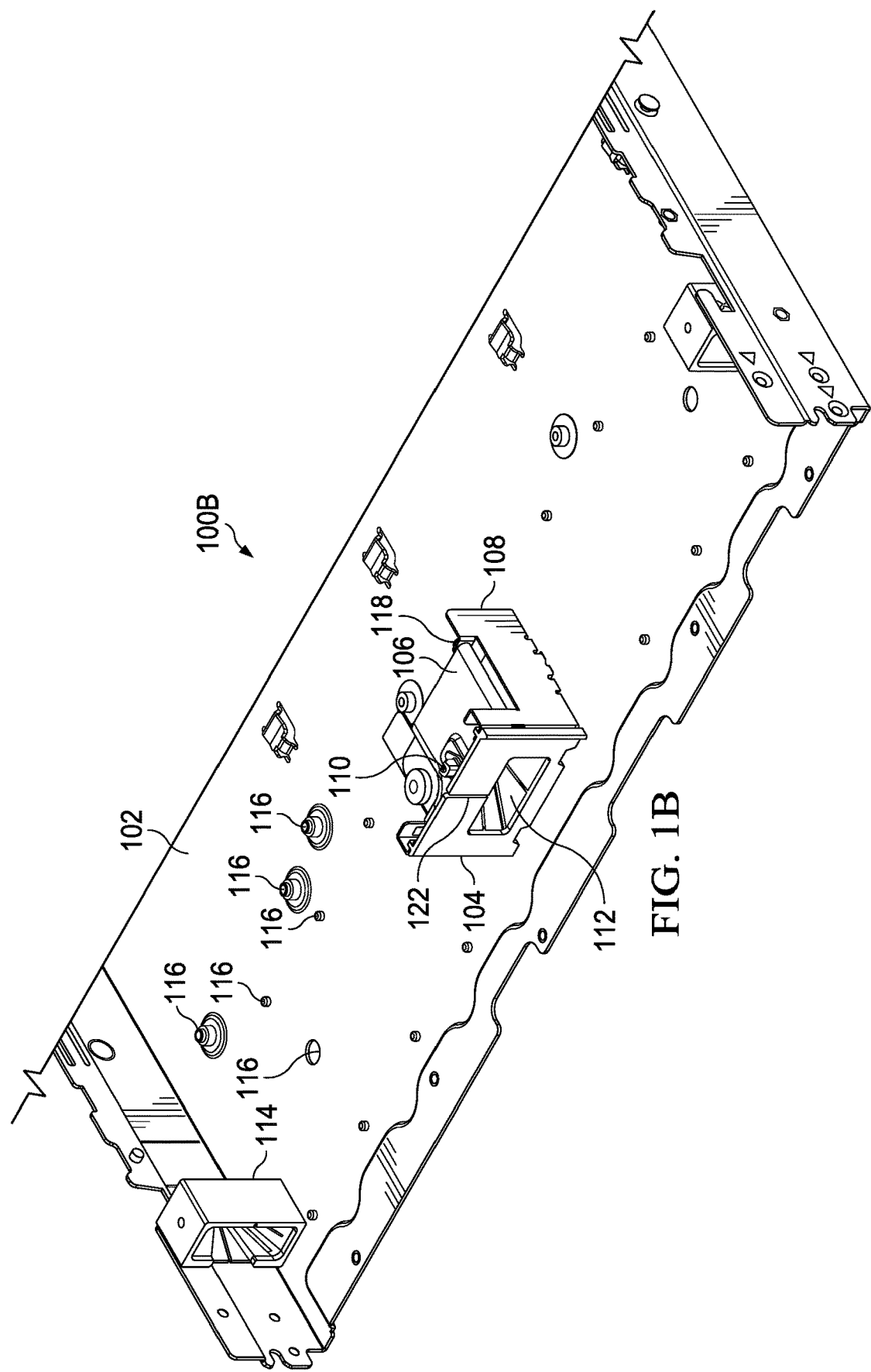
FIG. 1B is a diagram of an electronic component housing with a closed reconfigurable cable access component, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

Housing of electronic components is typically customized for a specific application. As a result, housing components that are capable of being reconfigured in the field for a specific modification are not well known. For example, it is not common for electronic component housing structures to be design to allow installation of cabling after completion of manufacturing. The present disclosure provides a system with reconfigurable components that are able to accommodate routing of cables after manufacturing, such as to allow cables to be installed in the field after a component or cable is replaced or a new component is added.

In one example embodiment, the disclosed reconfigurable component does not require the use of any tools, and allows field personnel to simply open an access door to install a new cable. The access door can open from the top of the component, the side of the component or in other suitable manners. The number of cables disposed in the component can be easily increased or decreased.

In another example embodiment, the top cover can include an engagement device such as a pin, a latch, a sliding lock, a screw or other suitable devices that can be used to secure the top cover without preventing subsequent access. An air flow seal can be provided inside or around the periphery of the component to block air flow into and out of the electronic component housing.

FIG. 1A is a diagram of an electronic component housing 100A with an open reconfigurable cable access component 108, in accordance with an example embodiment of the present disclosure. Electronic component housing 100A can be fabricated from aluminum, steel, composite materials, plastic or other suitable materials. Base 102 includes a number of features 116 that can be used to secure housing components, including but not limited to reconfigurable cable access component 108. Reconfigurable cable access component 108 includes a door 106 which is shown in an open position, a latch assembly 110, a hinge 118, a seal 104, a cable channel 112 and an upper door support 120, and is configured to allow a user to install cabling within reconfigurable cable access component 108 when the door is open. Seal 104 includes adjacent flaps along a split line 122 that allow the cabling to be placed within the reconfigurable cable access component 108 while still providing a seal against air flow. In addition, non-reconfigurable cable access components 114 are disposed on either side of base 102.

Reconfigurable cable access component 108 can be fabricated from aluminum, steel, composite, plastic or other suitable materials, and can be the same material or a different material from the rest of electronic component housing 100A. Reconfigurable cable access component 108 can be formed from multiple sub-assemblies, which can likewise be formed from the same or different materials.

Door 106 can be fabricated from aluminum, steel, composite, plastic or other suitable materials, and can be the same material or a different material from the rest of electronic component housing 100A. Door 106 can be configured to open 90 degrees, 180 degrees or other suitable amounts, or can be configured to rotate open or open in other suitable manners. While a door 106 is shown in an example embodiment that is quasi-flat, quasi-rectangular and that opens vertically, other suitable embodiments can also or alternatively be used, such as arcuate shapes, irregular shapes or other suitable shapes. Door 106 can also include a captive screw that attached to upper door support 120, which allows a user to secure door 106 to door support 120 without the need for tools.

Latch assembly 110 can be fabricated from aluminum, steel, composite, plastic or other suitable materials, and can be the same material or a different material from the rest of electronic component housing 100A. Latch assembly 110 can be configured as a spring-loaded self-locking latch that can be manually released, or in other suitable manners. In one example embodiment, latch assembly 110 can be screw-locked, can have a button release, can be a clip or can use other suitable mechanisms.

Hinge 118 can be fabricated from aluminum, steel, composite, plastic or other suitable materials, and can be the same material or a different material from the rest of electronic component housing 100A. Hinge 118 can be an axle hinge, a butt hinge, a barrel hinge, a piano hinge, a butterfly hinges, a flush hinge, a pivot hinge, a spring hinge, a gate hinge or other suitable hinges. In one example embodiment, latch assembly 110 can be screw-locked, can have a button release, can be a clip or can use other suitable mechanisms.

Features 116 can be fabricated from aluminum, steel, composite, plastic or other suitable materials, and can be the same material or a different material from the rest of electronic component housing 100A. Features 116 can include knobs, slots, penetrations, rivets or other suitable features that can be used to attached components to base 102.

Seal 104 can be fabricated from rubber, polymers, elastomers, composites, plastic or other suitable materials, and can be the same material or a different material from the rest of electronic component housing 100A. In one example embodiment, seal 104 can have lugs that are disposed in a channel on the side of reconfigurable cable access component 108, can be secured by an adhesive to reconfigurable cable access component 108 or can be attached in other suitable manners.

Cable channel 112 can be fabricated from rubber, polymers, elastomers, composites, plastic, aluminum, metal or other suitable materials, and can be the same material or a different material from the rest of electronic component housing 100A. In one example embodiment, cable channel 112 can have a variable inner diameter that is open on one side and closed on three sides and that is secured to the interior of reconfigurable cable access component 108 with an adhesive, or can be configured and attached in other suitable manners.

Upper door support 120 can be fabricated from aluminum, steel, composite, plastic or other suitable materials, and can be the same material or a different material from the rest of electronic component housing 100A. In one example embodiment, upper door support 120 forms a flat surface to close flush against door 106.

Adjacent flaps along a split line 122 form a resealable opening to allow cables to be placed in cable channel 112. These adjacent flaps along split line 122 also form a barrier to minimize the flow of air into or out of the equipment housing.

In operation, reconfigurable cable access component 108 can be used to allow personnel to install cables in an equipment housing after manufacture, such as to support field modifications, repairs or other changes to the equipment housing. Reconfigurable cable access component 108 provides easy cable routing in combination with top cover engagement and air flow sealing, and thus provides an improvement to prior art approaches of non-reconfigurable equipment housing designs.

FIG. 1B is a diagram of an electronic component housing 100B with a closed reconfigurable cable access component 108, in accordance with an example embodiment of the present disclosure. Electronic component housing 100B is configured to allow door 106 of reconfigurable cable access component 108 to be opened and closed, and for cabling to be placed within or removed from reconfigurable cable access component 108. The operation of latch assembly 110 and hinge 118 can also be seen in electronic component housing 100B.

FIG. 2A is a diagram of an electronic component housing 200A with an open reconfigurable cable access component 108, cabling 202 and fan housing assemblies 204, in accordance with an example embodiment of the present disclosure. Cabling 202 is placed within open reconfigurable cable access component 108, having been inserted through adjacent flaps along split line 122 of seal 104. In addition, fan housing assemblies 204 are also provided and are disposed on either side of reconfigurable cable access component 108.

Figure 2B:
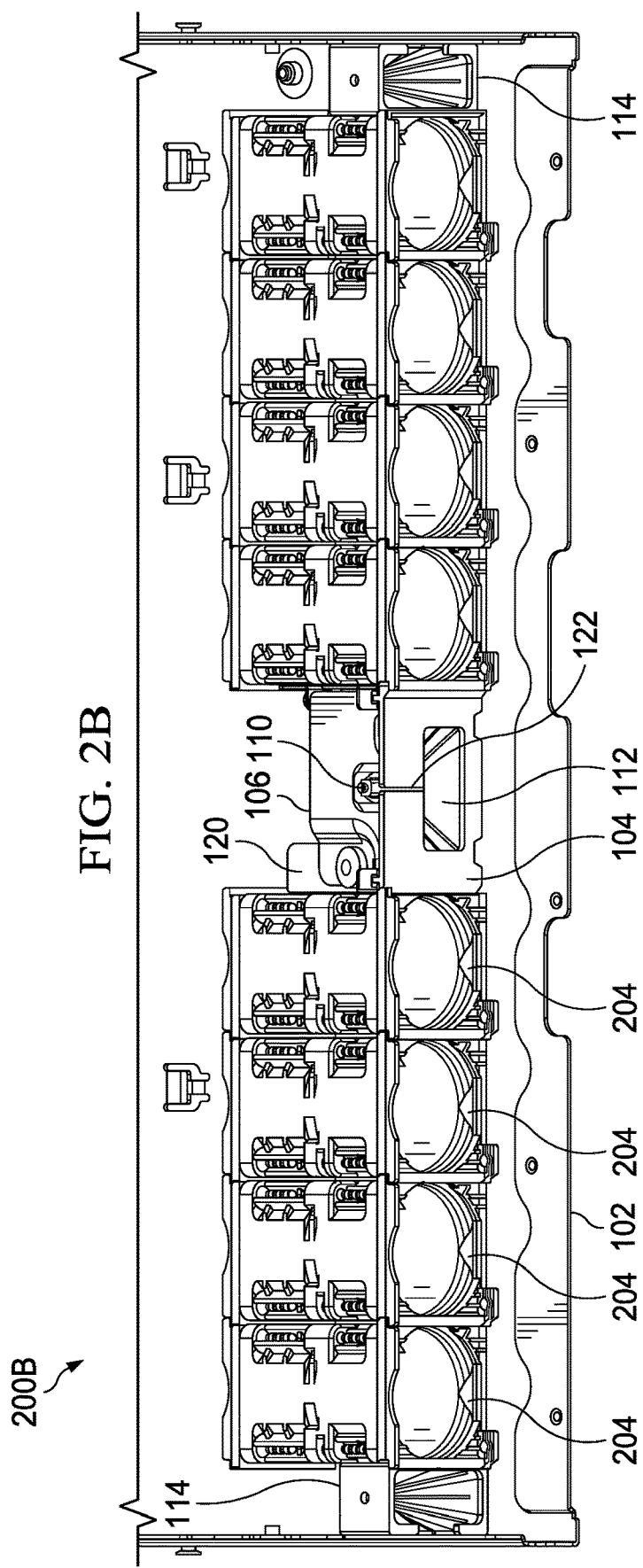
FIG. 2B is a diagram of an electronic component housing with a closed reconfigurable cable access component and fan housing assemblies, in accordance with an example embodiment of the present disclosure.

FIG. 2B is a diagram of an electronic component housing 200B with a closed reconfigurable cable access component 108 and fan housing assemblies, in accordance with an example embodiment of the present disclosure. Electronic component housing 200B shows latch assembly 110, and door 106 closed against upper door support 120.

Figure 3:
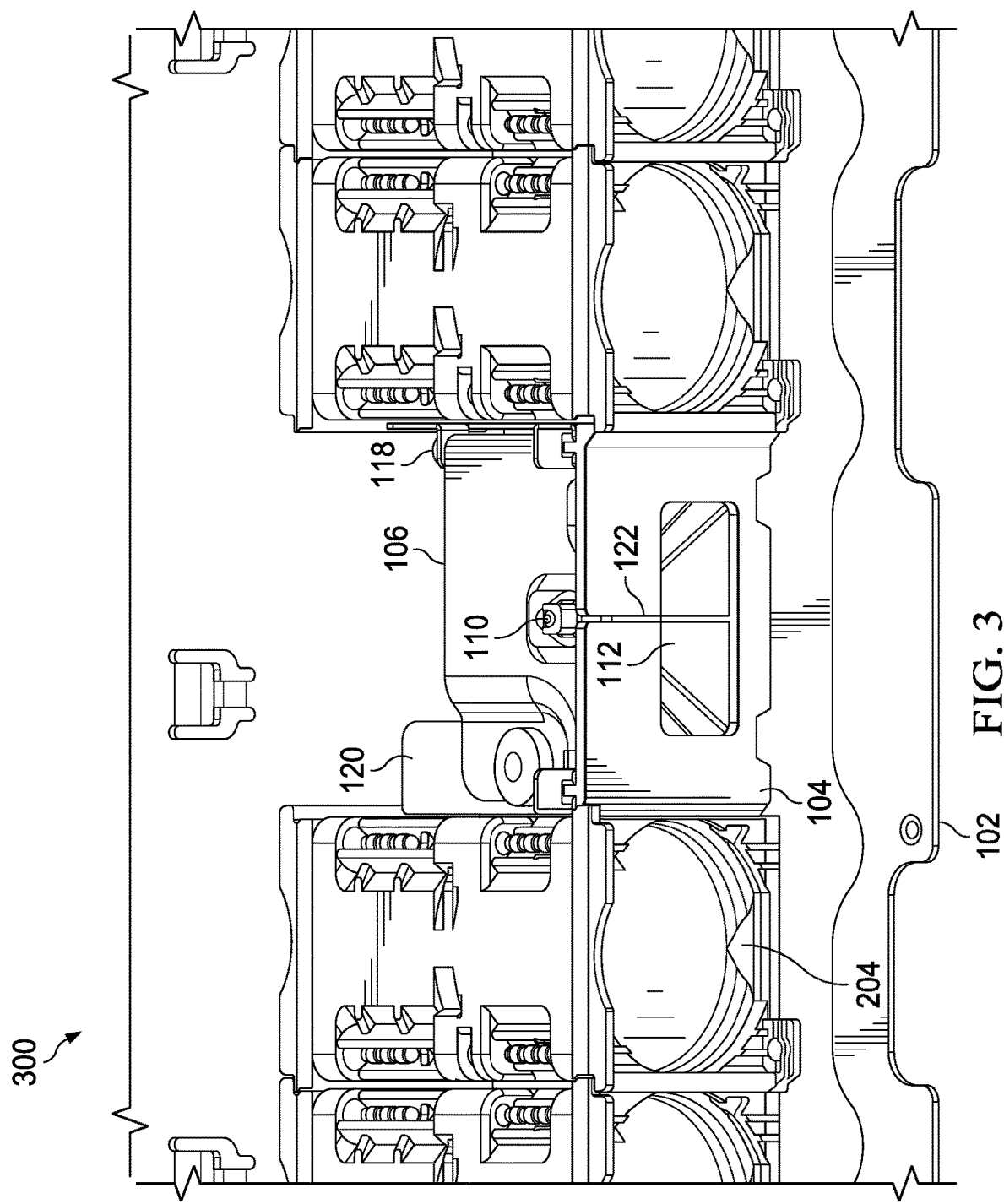
FIG. 3 is a diagram of an electronic component housing with a closed reconfigurable cable access component and a locking device, in accordance with an example embodiment of the present disclosure.

FIG. 3 is a diagram of an electronic component housing 300 with a closed reconfigurable cable access component 108 and a locking device 302, in accordance with an example embodiment of the present disclosure.

In one example, an assembly is disclosed that includes a planar surface, a reconfigurable housing disposed on the planar surface, a hinge assembly coupled to the reconfigurable housing, a door coupled to the hinge assembly, the door having a latch that is configured to secure the door in a closed position against the reconfigurable housing and a seal configured to reduce airflow through the reconfigurable housing. The planar surface can further comprise a plurality of features that are configured to secure one or more components to the planar surface. The reconfigurable housing can further comprise a door support configured to interface with the door. The hinge assembly can further comprise a barrel hinge. The door can further comprise a planar surface. The seal can further comprise a rectangular frame disposed at an end of the reconfigurable housing. The reconfigurable housing can further comprise a cable channel configured to hold a plurality of cables. The seal can further comprise a rectangular frame disposed at an end of the cable channel. The seal can further comprise a rectangular frame disposed at an end of the reconfigurable housing with a slit configured to allow a plurality of cables to be placed in an interior channel through the seal. The seal can further comprises a rectangular frame disposed at an end of the reconfigurable housing and having a pair of flaps configured to allow a plurality of cables to be placed within the seal. A plurality of fan housing assemblies can be disposed adjacent to the reconfigurable housing. The planar surface can further comprise a plurality of features that are configured to secure one or more components to the planar surface and the reconfigurable housing comprises a door support configured to interface with the door. The hinge assembly can comprise a barrel hinge and the door comprises a planar surface. The seal can comprise a rectangular frame disposed at an end of the reconfigurable housing and the reconfigurable housing comprises a cable channel configured to hold a plurality of cables. The seal can comprise a rectangular frame disposed at an end of the reconfigurable housing with a slit configured to allow a plurality of cables to be placed in an interior channel through the seal. The seal can comprise a rectangular frame disposed at an end of the reconfigurable housing and having a pair of flaps configured to allow a plurality of cables to be placed within the seal and further comprising a plurality of fan housing assemblies disposed adjacent to the reconfigurable housing.

In another example, an assembly is disclosed that comprises a planar surface further comprising a plurality of features that are configured to secure one or more components to the planar surface. A reconfigurable housing disposed on the planar surface and further comprising a door support configured to interface with the door and a cable channel configured to hold a plurality of cables. A hinge assembly coupled to the reconfigurable housing and comprising a piano hinge. A door coupled to the hinge assembly, the door having a planar surface and a latch that is configured to secure the door in a closed position against the reconfigurable housing. A seal comprising a rectangular frame disposed at an end of the cable channel of the reconfigurable housing and configured to reduce airflow through the reconfigurable housing, the seal having a slit between a pair of flaps that are configured to allow a plurality of cables to be placed in an interior channel through the seal. A plurality of fan housing assemblies disposed adjacent to the reconfigurable housing.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. An assembly comprising:
   a planar surface;
   a housing disposed on the planar surface proximate to a center of the planar surface and surrounded by a space on at least two sides;
   a hinge assembly coupled to the housing;
   a door coupled to the hinge assembly, the door having a latch that is configured to secure the door in a closed position against the housing; and
   a seal configured to reduce airflow through the housing, wherein the seal comprises a rectangular frame disposed at an end of the housing with a slit configured to allow a plurality of cables to be placed in an interior channel through the seal.

2. The assembly of claim 1 wherein the planar surface further comprises a plurality of features that are configured to secure one or more components to the planar surface.

3. The assembly of claim 1 wherein the housing comprises a door support configured to interface with the door.

4. The assembly of claim 1 wherein the hinge assembly comprises a barrel hinge.

5. The assembly of claim 1 wherein the door comprises a planar surface.

6. The assembly of claim 1 wherein the seal comprises a rectangular frame disposed at an end of the housing.

7. The assembly of claim 1 wherein the housing comprises a cable channel configured to hold a plurality of cables.

8. The assembly of claim 7 wherein the seal comprises a rectangular frame disposed at an end of the cable channel.

9. The assembly of claim 7 wherein the seal comprises a rectangular frame disposed at an end of the housing with a slit configured to allow a plurality of cables to be placed in an interior channel through the seal.

10. The assembly of claim 1 wherein the seal comprises a rectangular frame disposed at an end of the housing and having a pair of flaps configured to allow a plurality of cables to be placed within the seal.

11. The assembly of claim 1 further comprising a plurality of fan housing assemblies disposed adjacent to the housing.

12. The assembly of claim 1 wherein the planar surface further comprises a plurality of features that are configured to secure one or more components to the planar surface and the housing comprises a door support configured to interface with the door.

13. The assembly of claim 1 wherein the hinge assembly comprises a barrel hinge and the door comprises a planar surface.

14. The assembly of claim 1 wherein the seal comprises a rectangular frame disposed at an end of the housing and the housing comprises a cable channel configured to hold a plurality of cables.

15. The assembly of claim 1 wherein the seal comprises a rectangular frame disposed at an end of the housing and having a pair of flaps configured to allow a plurality of cables to be placed within the seal and further comprising a plurality of fan housing assemblies disposed adjacent to the housing.

16. An assembly comprising:
    a planar surface further comprising a plurality of features that are configured to secure one or more components to the planar surface;
    a housing disposed on the planar surface and further comprising a door support configured to interface with the door and a cable channel configured to hold a plurality of cables;
    a hinge assembly coupled to the housing and comprising a piano hinge;
    a door coupled to the hinge assembly, the door having a planar surface and a latch that is configured to secure the door in a closed position against the housing; and
    a seal comprising a rectangular frame disposed at an end of the cable channel of the housing and configured to reduce airflow through the housing, the seal having a slit between a pair of flaps that are configured to allow a plurality of cables to be placed in an interior channel through the seal; and
    a plurality of fan housing assemblies disposed adjacent to the housing.

17. An assembly comprising:
    a planar surface;
    a housing disposed on the planar surface proximate to a center of the planar surface and surrounded by a space on at least two sides;
    a hinge assembly coupled to the housing;
    a door coupled to the hinge assembly, the door having a latch that is configured to secure the door in a closed position against the housing; and
    a seal configured to reduce airflow through the housing, wherein the seal comprises a rectangular frame disposed at an end of the housing and having a pair of flaps configured to allow a plurality of cables to be placed within the seal.

18. The assembly of claim 17 wherein the planar surface further comprises a plurality of features that are configured to secure one or more components to the planar surface.

19. The assembly of claim 17 wherein the housing comprises a door support configured to interface with the door.

20. The assembly of claim 17 wherein the hinge assembly comprises a barrel hinge.

* * * * *